United States Patent
Adel et al.

(10) Patent No.: US 7,075,639 B2
(45) Date of Patent: Jul. 11, 2006

(54) METHOD AND MARK FOR METROLOGY OF PHASE ERRORS ON PHASE SHIFT MASKS

(75) Inventors: Michael Adel, Zichron Ya'akov (IL); Mark Ghinovker, Migdal Haemek (IL); Chris A. Mack, Austin, TX (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 343 days.

(21) Appl. No.: 10/423,827

(22) Filed: Apr. 25, 2003

(65) Prior Publication Data
US 2004/0212796 A1 Oct. 28, 2004

(51) Int. Cl.
*G01N 21/00* (2006.01)
*G01B 11/00* (2006.01)
*G06K 9/00* (2006.01)
*G03C 5/00* (2006.01)
*G03F 1/00* (2006.01)

(52) U.S. Cl. .............................. 356/237.5; 356/237.1; 356/399; 382/144; 382/145

(58) Field of Classification Search ............. None
See application file for complete search history.

(56) References Cited

U.S. PATENT DOCUMENTS

| | | | |
|---|---|---|---|
| 4,251,160 A | 2/1981 | Bouwhuis et al. | |
| 4,475,811 A | 10/1984 | Brunner | |
| 4,538,105 A | 8/1985 | Ausschnitt | |
| 4,703,434 A | 10/1987 | Brunner | |
| 4,714,874 A | 12/1987 | Morris et al. | |
| 4,757,207 A | 7/1988 | Chappelow et al. | |
| 4,757,707 A | 7/1988 | Harvey et al. | |
| 4,778,275 A | 10/1988 | van den Brink et al. | |
| 4,782,288 A | 11/1988 | Vento | |
| 4,820,055 A | 4/1989 | Muller | |
| 4,855,253 A | 8/1989 | Weber | |
| 4,929,083 A | 5/1990 | Brunner | |
| 5,017,514 A | 5/1991 | Nishimoto | |
| 5,100,237 A | 3/1992 | Wittekoek et al. | |
| 5,112,129 A | 5/1992 | Davidson et al. | |
| 5,148,214 A | 9/1992 | Ohta et al. | |
| 5,156,982 A | 10/1992 | Nagoya | |
| 5,172,190 A | 12/1992 | Kaiser | |
| 5,216,257 A | 6/1993 | Brueck et al. | |
| 5,262,258 A | 11/1993 | Yanagisawa | |
| 5,296,917 A | 3/1994 | Kusonose et al. | |
| 5,300,786 A | 4/1994 | Brunner et al. | |

(Continued)

FOREIGN PATENT DOCUMENTS

EP 0818814 1/1998

(Continued)

OTHER PUBLICATIONS

U.S. Appl. No. 09/697,025, filed Oct. 26, 2000.

(Continued)

*Primary Examiner*—Layla G. Lauchman
*Assistant Examiner*—Gordon J. Stock, Jr.
(74) *Attorney, Agent, or Firm*—Beyer Weaver & Thomas, LLP

(57) ABSTRACT

A method of inspecting a phase shift mask is disclosed. The method includes receiving a mask having an alternating phase shift pattern. The method also includes forming the alternating phase shift pattern on a wafer. The method further includes analyzing the alternating phase shift pattern on the wafer to determine the phase difference of the alternating phase shift pattern.

20 Claims, 10 Drawing Sheets

U.S. PATENT DOCUMENTS

| | | | |
|---|---|---|---|
| 5,383,136 A | | 1/1995 | Cresswell et al. |
| 5,414,514 A | | 5/1995 | Smith et al. |
| 5,436,097 A | | 7/1995 | Norishima et al. |
| 5,438,413 A | | 8/1995 | Mazor et al. |
| 5,439,767 A | * | 8/1995 | Yamashita et al. ............ 430/30 |
| 5,477,057 A | | 12/1995 | Angeley et al. |
| 5,479,270 A | | 12/1995 | Taylor |
| 5,481,362 A | | 1/1996 | van den Brink et al. |
| 5,498,501 A | | 3/1996 | Shimoda et al. |
| 5,596,413 A | | 1/1997 | Stanton et al. |
| 5,604,819 A | | 2/1997 | Barnard |
| 5,617,340 A | | 4/1997 | Cresswell et al. |
| 5,627,083 A | | 5/1997 | Tounai et al. |
| 5,661,546 A | | 8/1997 | Taniguchi |
| 5,665,495 A | | 9/1997 | Hwang |
| 5,674,650 A | | 10/1997 | Dirksen et al. |
| 5,699,282 A | | 12/1997 | Allen et al. |
| 5,701,013 A | | 12/1997 | Hsia et al. |
| 5,702,567 A | | 12/1997 | Mitsui et al. |
| 5,703,685 A | | 12/1997 | Senda et al. |
| 5,712,707 A | | 1/1998 | Ausschnitt et al. |
| 5,757,507 A | | 5/1998 | Ausschnitt et al. |
| 5,766,809 A | | 6/1998 | Bae |
| 5,783,342 A | | 7/1998 | Yamashita et al. |
| 5,805,290 A | | 9/1998 | Ausschnitt et al. |
| 5,807,647 A | * | 9/1998 | Hashimoto ..................... 430/5 |
| 5,835,196 A | | 11/1998 | Jackson |
| 5,856,049 A | | 1/1999 | Lee |
| 5,857,258 A | | 1/1999 | Penzes et al. |
| 5,872,042 A | | 2/1999 | Hsu et al. |
| 5,877,036 A | | 3/1999 | Kawai |
| 5,877,861 A | | 3/1999 | Ausschnitt et al. |
| 5,902,703 A | | 5/1999 | Leroux et al. |
| 5,912,983 A | | 6/1999 | Hiratsuka |
| 5,923,041 A | | 7/1999 | Cresswell et al. |
| 5,936,738 A | | 8/1999 | Liebmann et al. |
| 5,939,226 A | | 8/1999 | Tomimatu |
| 5,949,145 A | | 9/1999 | Komuro |
| 5,960,125 A | | 9/1999 | Michael et al. |
| 5,965,309 A | | 10/1999 | Ausschnitt et al. |
| 5,968,693 A | | 10/1999 | Adams |
| 5,976,740 A | | 11/1999 | Ausschnitt et al. |
| 6,020,966 A | | 2/2000 | Ausschnitt et al. |
| 6,023,338 A | | 2/2000 | Bareket |
| 6,061,606 A | | 5/2000 | Ross |
| 6,077,756 A | | 6/2000 | Lin et al. |
| 6,079,256 A | | 6/2000 | Bareket |
| 6,084,679 A | | 7/2000 | Steffan et al. |
| 6,118,185 A | | 9/2000 | Chen et al. |
| 6,128,089 A | | 10/2000 | Ausschnitt et al. |
| 6,130,750 A | | 10/2000 | Ausschnitt et al. |
| 6,137,578 A | | 10/2000 | Ausschnitt |
| 6,140,217 A | | 10/2000 | Jones et al. |
| 6,146,910 A | | 11/2000 | Cresswell et al. |
| 6,160,622 A | | 12/2000 | Dirksen et al. |
| 6,165,656 A | | 12/2000 | Tomimatu |
| 6,384,899 B1 | | 5/2002 | den Boef |
| 6,396,569 B1 | | 5/2002 | Zheng et al. |
| 6,416,909 B1 | | 7/2002 | Quek et al. |
| 6,420,075 B1 | | 7/2002 | Okamoto |
| 6,462,818 B1 | | 10/2002 | Bareket |
| 6,486,954 B1 | | 11/2002 | Mieher et al. |
| 6,596,448 B1 | * | 7/2003 | Lai et al. ....................... 430/30 |
| 6,710,876 B1 | | 3/2004 | Nikoonahad et al. |
| 6,884,552 B1 | * | 4/2005 | Mieher et al. ................. 430/5 |
| 2001/0055720 A1 | | 12/2001 | Sato et al. |
| 2002/0018217 A1 | | 2/2002 | Weber-Grabau et al. |
| 2002/0021434 A1 | | 2/2002 | Nomura et al. |
| 2002/0197542 A1 | | 12/2002 | Lai et al. |
| 2003/0002043 A1 | | 1/2003 | Abdulhalim et al. |
| 2003/0048458 A1 | | 3/2003 | Mieher et al. |
| 2003/0095267 A1 | | 5/2003 | Mieher et al. |
| 2003/0223630 A1 | | 12/2003 | Adel et al. |

FOREIGN PATENT DOCUMENTS

| | | |
|---|---|---|
| EP | 0947828 | 10/1999 |

OTHER PUBLICATIONS

U.S. Appl. No. 09/894,987, filed Jun. 27, 2001.

Dirksen, et al., "Novel aberration monitor for optical lithography", Part of the SPIE Conference on Optical Microlithography XII, Santa Clara, CA Mar. 1999, SPIE vol. 3676, p. 77-86.

Farrar et al., "In-situ measurement of lens aberrations", Mar. 2000 Proceedings of SPIE Vo. 4000, Optical Microlithography XIII.

Ghinovker et al., Patent Application Entitled "Overlay Marks, Methods of Overlay Mark Design and Methods of Overlay Measurements", Filed Jun. 27, 2001 as U.S. Appl. No. 09/894,987.

Hsu et al., "Characterizing lens distortion to overlay accuracy by using fine measurement pattern", Mar. 1999, SPIE vol. 3677.

Levinson et al., "Minimization of Total Overlay Errors on Product Wafers Using an Advanced Optimization Scheme", SPIE vol. 3051 (1997) p. 362-373.

Levinson, "Lithography Process Control", Tutorial Texts in Optical Engineering, vol. TT28, Chapter 5, pp. 96-107.

Monshouwer et al., "Method of Measuring Overlay", Overlay, pp. 94-107, Chapter 5, Jun. 27, 2002.

Nikoonahad et al., Patent Application Entitled "Overlay Error Detection", Filed Oct. 26, 2000 as U.S. Appl. No. 09/697,025.

Normura, "Measurement of Wave-Front Aberrations in Lithography Lenses with an Overlay Inspection Tool", Optical Review No. 8, vol. 4 (2001) p. 227-234.

Rivera et al., "Overlay Performance on Tungsten CMP Layers Using the ATHENA Alignment System".

Schenker et al., "Alt-PSM for 0.10um and 0.13um poly patterning", Proc. of SPIE Vo. 4000, Optical Microlithography XIII, ed. C. Progler, Mar. 2000.

International Search Report from International Application No. PCT/US04/12506 dated Dec. 12, 2005.

US 5,841,144, 11/1998, Cresswell (withdrawn)

* cited by examiner

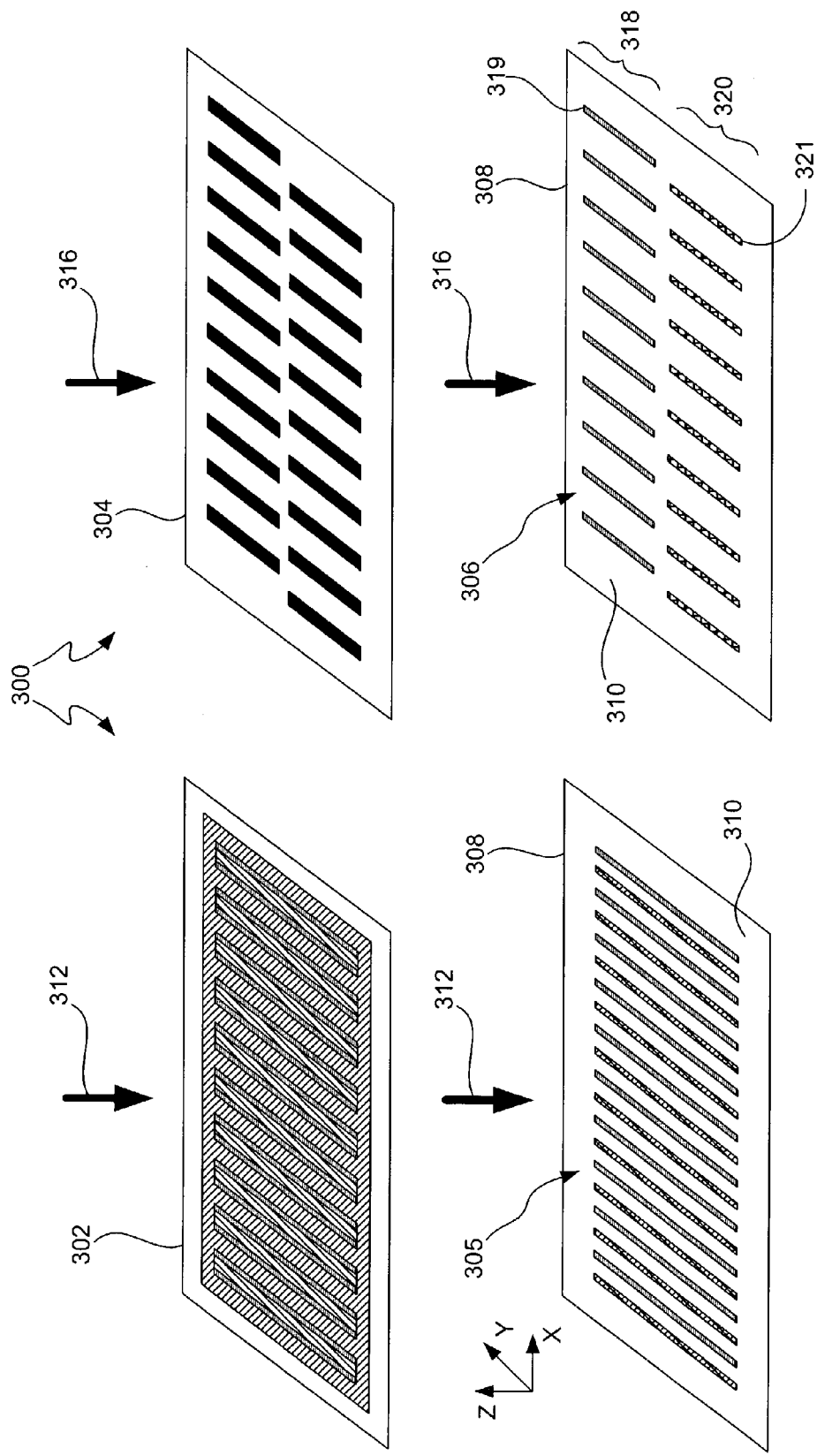

METHOD AND MARK FOR METROLOGY OF PHASE ERRORS ON PHASE SHIFT MASKS

CROSS REFERENCE TO RELATED APPLICATION

This application is related to U.S. patent application Ser. No. 10/291,181, filed on Nov. 7, 2002, and U.S. patent application Ser. No. 09/894,987, filed on Jun. 27, 2001, both of which are hereby incorporated by reference.

BACKGROUND OF THE INVENTION

The present invention relates generally to photolithography methods and systems, and more specifically to improved techniques for determining phase errors associated with phase shift masks.

Integrated circuits are made by lithographic processes, which use lithographic masks and an associated light or radiation source to project a circuit image onto a wafer As should be appreciated, the kind of lithography generally depends on the wavelength of the radiation used to expose the resist (e.g., LJV radiation, x ray radiation, e beam, ion beam and the like). Referring to FIG. 1, a simplified diagram of a lithography system 2 is shown. By way of example, the lithography system may correspond to a stepper or scanning system. The lithography system 2 typically includes a light or radiation source 3 and a first set of optics 4 that illuminate a reticle or mask 5 having a circuit pattern 6 disposed thereon. The lithography system 2 also includes a second set of optics 7 that pick up the transmitted light or radiation and focuses (or images) it onto a surface 9 of a semiconductor wafer 8 thus writing the pattern of the mask 5 onto the surface 9 of the semiconductor wafer 8. In most cases, the semiconductor wafer 8 includes a layer of photoresist that when exposed to the patterned light or radiation forms the pattern of the mask onto the wafer. The reticles or masks come in various forms, however, they typically include opaque portions (e.g. chrome lines) and/or transmissive portions (e.g., quartz). The opaque portions block the light from passing through the mask 5 while the transmissive portions allow the light to pass therethrough.

Alternating Phase Shift Masks (AltPSM), which include opaque portions separated by alternating phase shifted transmissive portions, have become an important and enabling technology currently reaching maturity within the lithography environment. This technology, although initially proposed simultaneously in Japan and the United States as long as 20 years ago, is starting to become a mainstream technique for achieving smaller k1 values in the lithography of critical process layers, specifically the poly to gate layer. Alternating Phase Shift Masks are used at this process layer in particular since the requirement for the smallest possible pitch is crucial in terms of packing density. Alternating Phase Shift Masks achieve a reduction in minimum pitch by disposing phase shifted transmissive portions, in which the optical phase alternates by 180 degrees, in between the opaque portions. In most cases, the AltPSM includes chrome lines (opaque portion), which are separated by different phase shifted portions of a quartz substrate (transmissive portions). The different phase shifted portions are typically formed by etching the quartz substrate. The different phase shifted portions may also be altered by the addition of an attenuating phase shifter (e.g., attenuated phase shift reticles).

FIG. 2 consists of illustrations showing an alternating phase shift pattern 10 of a phase shift mask 12, an amplitude profile 14 of the light passing through the alternating phase shift pattern 10, and a resulting pattern 16 formed on a wafer 18. As shown, the phase shift mask 12 includes a substrate 22 formed from quartz, a plurality of chrome lines 24 and alternating phase shift zones 26 and 28 disposed between the chrome lines 24. The phase shift zones 26 correspond to the exposed surface of the quartz substrate 22 and the second phase shift zones 28 correspond to portions of the quartz substrate 22 that have been etched. The phases of the phase shift zones 26 and 28 are opposite one another (e.g., 180 degrees). As should be appreciated, as light traverses the quartz substrate 22, there is a phase shift that is induced in the light that traverses the etched quartz compared to the light that traverses the un etched quartz. The opposite phase creates a situation where the light intensity has to go through zero. These zero points correspond to where the light destructively interferes thus forming a dark line between the two phase shifted areas 26 and 28. The dark lines do not expose the photoresist 30 disposed on the wafer 18 and thus a resulting pattern 16 is formed on the wafer 18.

Unfortunately, however, this method introduces a number of new challenges. One of the challenges is achieving consistent and accurate phase differences between adjacent transmissive portions in the Alternating Phase Shift Masks. This is critical since phase errors associated with phase difference can introduce additional pattern placement errors of the lines and spaces in the subsequent lithography process thereby making overlay control difficult. As should be appreciated, overlay generally refers to the determination of how accurately a first circuit pattern aligns with respect to a second circuit pattern. Overlay errors are generally determined by measuring the relative shift between first and second overlay targets with overlay metrology tools. This new kind of pattern placement error cannot be measured using standard overlay metrology targets. Phase errors, however, can be characterized by detailed measurements of the Alternating Phase Shift Masks themselves on a dedicated Alternating Phase Shift Masks inspection tool. Typically such Alternating Phase Shift Masks inspection tools are available only at the point of reticle manufacture. That is, they are not located within the production environment. By way of example, one such phase shift inspection tool is manufactured by Lasertec of Japan.

In view of the foregoing, there is a desire for improved techniques for determining phase error associated with phase shift masks, and further improved techniques for determining phase error associated with phase shift masks at a point during wafer processing.

SUMMARY OF THE INVENTION

The invention relates, in one embodiment, to a method of inspecting a mask. The method includes receiving a mask having an alternating phase shift pattern. The method also includes forming the alternating phase shift pattern on a wafer. The method further includes analyzing the alternating phase shift pattern on the wafer to determine the phase difference of the alternating phase shift pattern.

The invention relates, in another embodiment, to a method of determining the phase difference of an alternating phase shift pattern of a phase shift mask. The method includes providing calibration data relating at least pattern shift to phase difference. The method also includes providing a wafer with the alternating phase shift pattern formed thereon. The method further includes measuring the pattern shift of the alternating phase shift pattern using an overlay metrology tool. The method additionally includes converting the pattern shift to phase difference based at least in part on the measured pattern shift and the calibration data.

The invention relates, in another embodiment, to a phase shift mark for placement on an alternating phase shift mask having a circuit pattern formed thereon. The phase shift mark helps to determine the phase difference of the circuit pattern of the alternating phase shift mask during wafer processing. The phase shift mark includes a test pattern having a set of opaque lines separated by alternating first and second transmissive lines. The first and second transmissive lines producing a phase difference therebetween. The opaque and transmissive lines can be configured similarly to the features of the circuit pattern formed on the alternating phase shift mask. The test pattern is configured to produce first and second set of lines on a wafer during wafer processing that shift relative to one another so that they are measurable by an overlay metrology tool. The shift is based at least in part on the phase difference of the first and second transmissive lines.

BRIEF DESCRIPTION OF THE DRAWINGS

The present invention is illustrated by way of example, and not by way of limitation.

FIGS. 8A–8C are diagrams of a masking system, in accordance with one embodiment of the invention.

DETAILED DESCRIPTION OF THE INVENTION

The present invention generally pertains to improved techniques for determining phase errors associated with phase shift masks. Phase error generally refers to the difference between an optimal phase difference for a phase shift mask and the actual phase difference of a phase shift mask. One aspect of the invention relates to measuring phase errors in a production environment as for example in a semiconductor fab. Another aspect of the invention relates to determining the phase errors in tandem with standard overlay errors on an overlay metrology tool. It has been found that phase errors can introduce pattern shifts if the phase difference between adjacent lines is not exactly 180 degrees (a portion of the lines shift in a first direction and a portion of the lines shift in a second direction opposite the first direction). These shifts can therefore be utilized to determine the phase errors of the phase shift mask using standard or conventional overlay techniques and equipment such as imaging, scanning, scatterometry and the like, which are already set up to measure pattern shifts. The pattern shift created by phase errors is not always in a form capable of being measured by conventional overlay techniques and equipment, and thus another aspect of the invention relates to phase shift marks or targets that produce pattern shifts that are measurable by conventional overlay techniques and equipment.

Embodiments of the invention are discussed below with reference to FIGS. 3–9. However, those skilled in the art will readily appreciate that the detailed description given herein with respect to these figures is for explanatory purposes as the invention extends beyond these limited embodiments.

Figure 1:
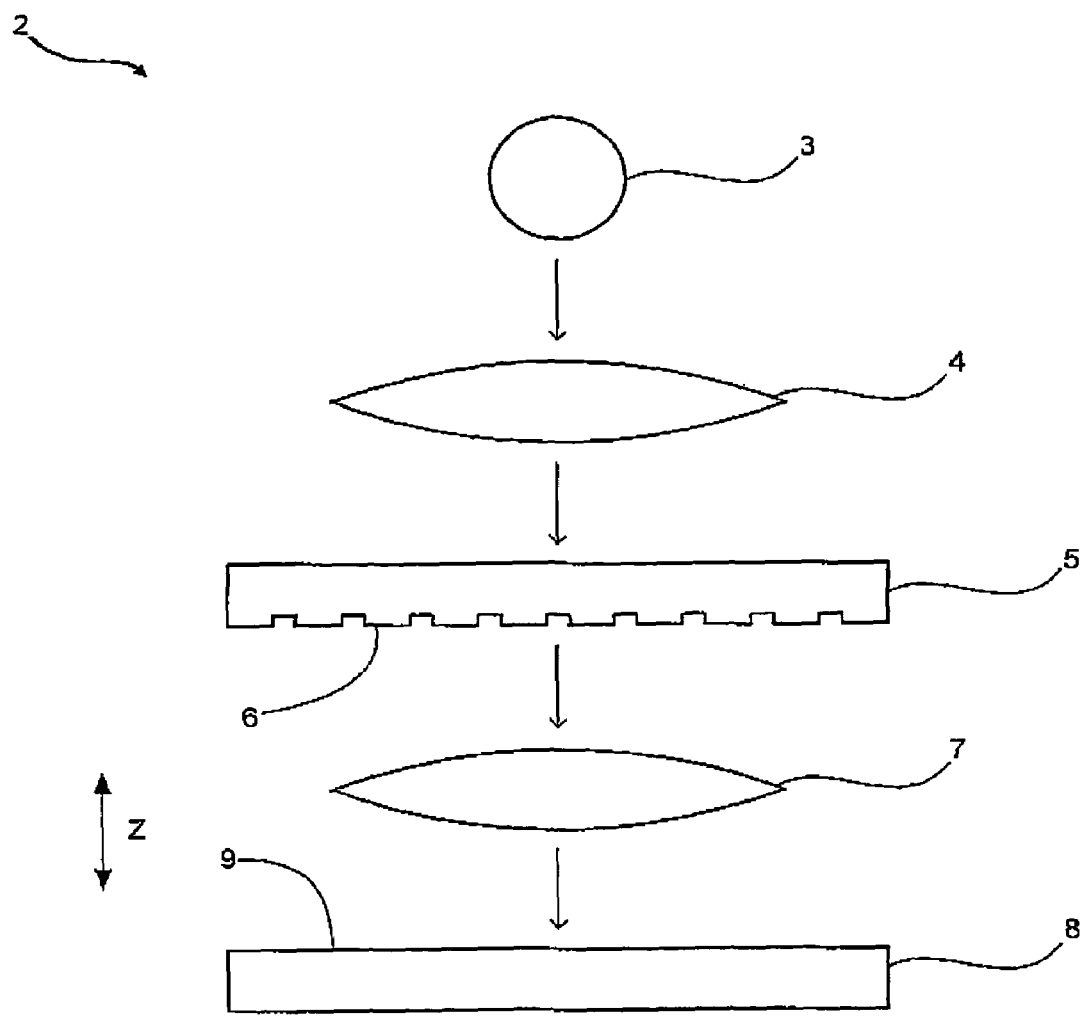
FIG. 1 is a simplified diagram of a lithography system.
Figure 2:
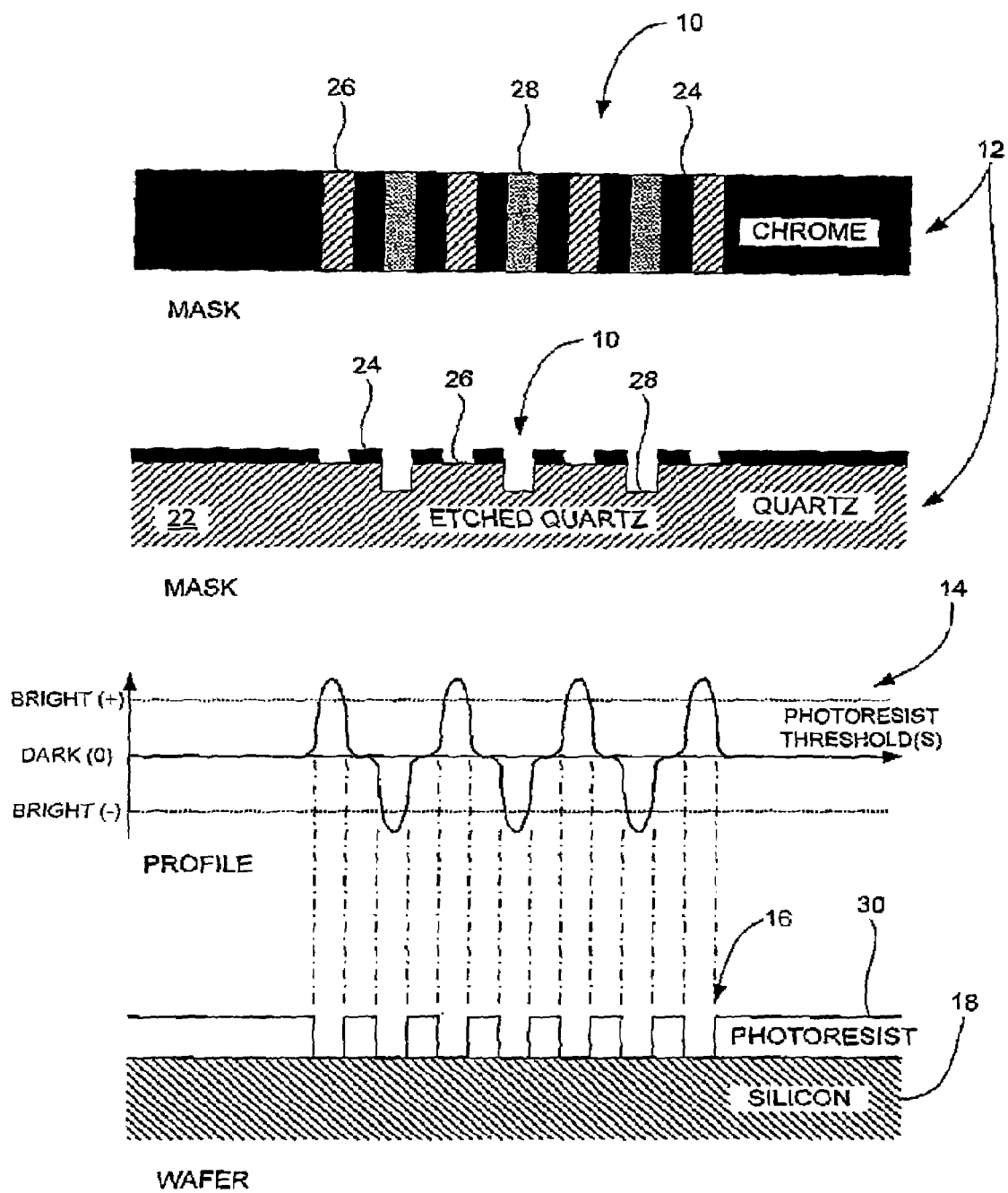
FIG. 2 is a diagram of a phase shift mask, amplitude profile and wafer.
Figure 3:
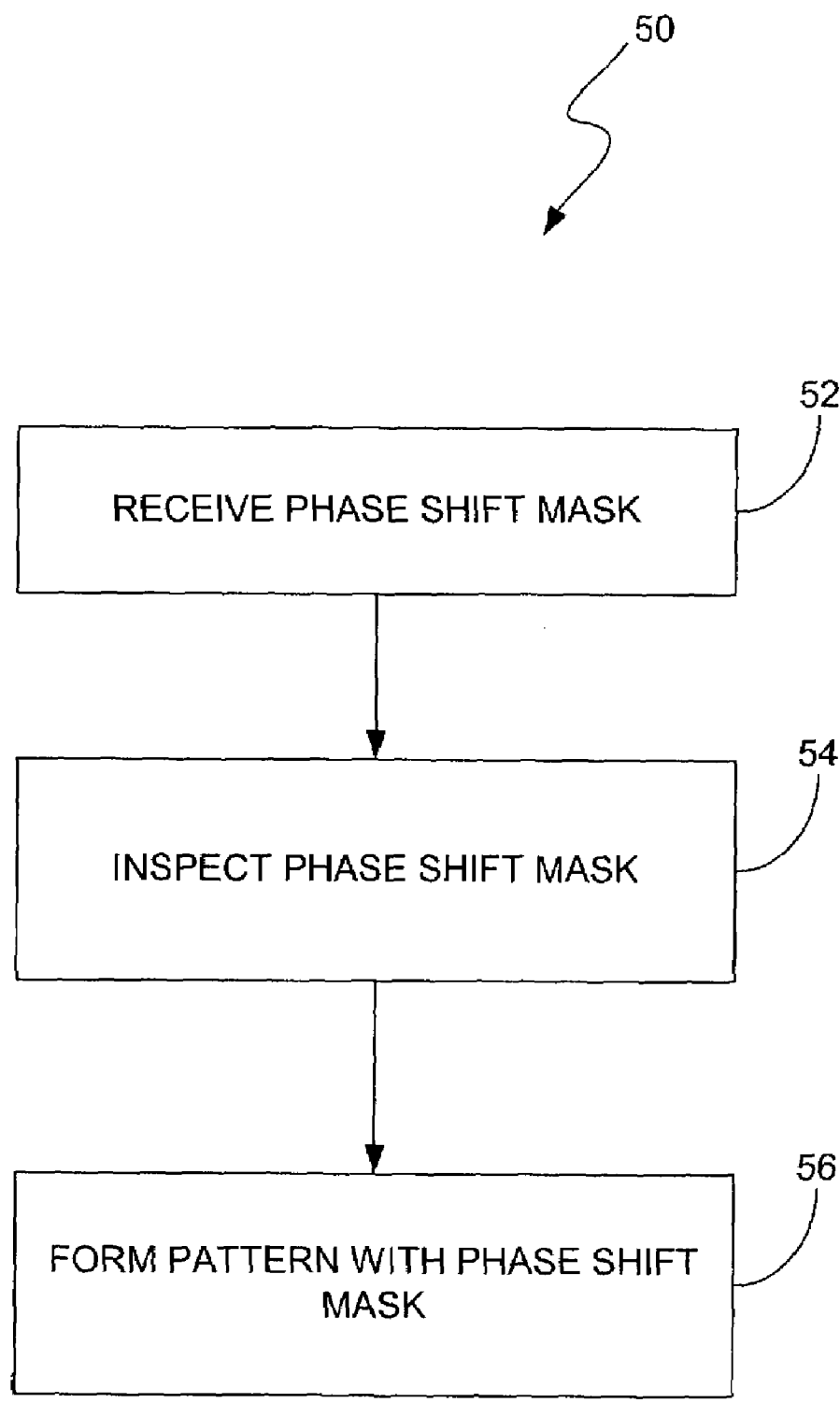
FIG. 3 is a lithographic method, in accordance with one embodiment of the present invention.

FIG. 3 is a lithographic method 50, in accordance with one embodiment of the present invention. The lithographic method is generally configured for a semiconductor fab in order to produce a semiconductor device. In the semiconductor fab environment, the lithographic method is part of a lithographic process used to transfer patterns from one or more masks to resist layers disposed on a semiconductor wafer. In this particular embodiment, at least one of the masks used to form the semiconductor device is a phase shift mask.

The method generally begins at block 52 where a phase shift mask is received for production. The phase shift mask includes a circuit pattern and an overlay target structure. The circuit pattern is used to form a corresponding pattern in the semiconductor device. The overlay target is used to determine the amount of pattern placement error between multiple circuit patterns, as for example circuit patterns formed from different masks. After receiving the phase shift mask, the process flow proceeds to block 54 where the mask is inspected. Many types of inspections may be performed. In one particular embodiment, however, at least a phase error inspection is performed to determine the phase error of the phase shift mask. If the phase error is outside desired limits, the mask may be discarded. If the phase error is within desired limits then the mask may be accepted for a production run (e.g., repeatedly used to form multiple patterns). The phase error may be determined using variety of in situ or ex situ tools including phase shift inspection tools or overlay metrology tools. Phase shift inspection tools are typically configured to directly measure the phase difference of phase shifted structures of the mask while overlay metrology tools are configured to indirectly measure the phase difference of phase shifted structures of the mask. In one embodiment, the phase shifted structures correspond to dedicated targets or marks that are used solely to determine the phase difference. With regards to using overlay tools, the targets or marks are generally configured to produce shifts that are measurable by the overlay tools. Methods of using overlay metrology tools, which is generally preferred since they already exist in the production environment, to determine phase errors of a phase shift mask will be described in greater detail below.

After inspecting the phase shift mask, the process flow proceeds to block 56 where the phase shift mask is used in the production environment to form the circuit pattern on a semiconductor wafer. In most cases, the phase shift mask is used along with other masks (both regular and phase shift) to build a semiconductor device. For example multiple masks may be used for various layers of a semiconductor wafer to build the semiconductor device on the semiconductor wafer. The overlay target is also formed on the semiconductor wafer during the formation of the circuit pattern. The overlay target is measured by an overlay metrology tool to ensure that previous and subsequent circuit patterns are properly aligned with one another. The overlay metrology tool used to measure the overlay error may be the same tool used to determine phase error or it may be a different tool altogether. One example of an overlay metrology tool that can be used is the Archer 10 manufactured by KLA-Tencor of Milpitas, Calif.

Figure 4:
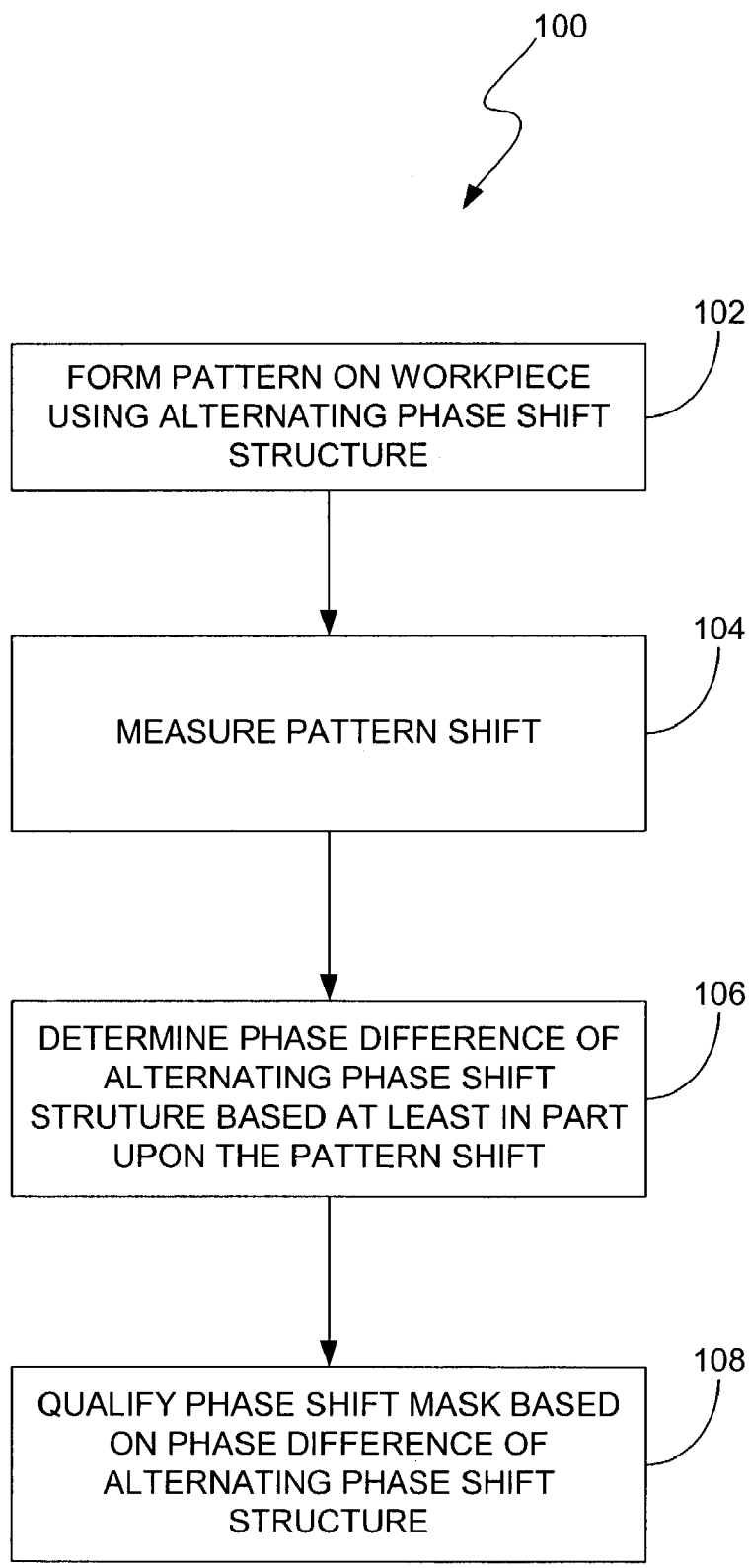
FIG. 4 is a phase shift mask inspection method, in accordance with one embodiment of the present invention.

FIG. 4 is a phase shift mask inspection method 100, in accordance with one embodiment of the present invention. The method is generally configured to determine the quality of a phase shift mask. The method may be suitable for a wide variety of photolithography processes, as for example, photolithographic processes pertaining to semiconductor manufacturing, optical device manufacturing, micro-mechanical device manufacturing, magnetic recording data storage manufacturing and the like. Although the inspection method may be used in any of the above processes, the invention described herein is directed at semiconductor manufacturing for ease of discussion. The method is generally performed in the semiconductor fab in the production environment prior to using the phase shift mask in a production run. The method may be performed once per mask as part of an incoming mask inspection procedure as well as periodically as part of a periodic mask qualification procedure.

The method generally begins at block 102 where a pattern is formed on a wafer using an alternating phase shift structure. The alternating phase shift structure may be a portion of a circuit pattern or it may be a dedicated target or mark located on the phase shift mask. The alternating phase shift structure generally includes a plurality of source lines separated by alternating phase shift zones. If the phase shift mask is optimal then the alternating phase shift zones have a phase difference of 180 degrees. If the phase shift mask is not optimal then the alternating phase shift zones have a phase difference higher or lower than 180 degrees (e.g., the phase difference may be higher or lower depending on the quality of the phase shift mask). As should be appreciated, mask manufacturing may produce phase differences other than 180 degrees, as for example, anywhere between 165 and 195 degrees. When something other than 180 degrees is manufactured, the pattern is configured to include portions that shift (e.g., a shiftable pattern is formed on the substrate). For example, the pattern may include a first set of lines that shift in a first direction and a second set of lines that shift in a second direction. The amount that these lines shift relative to one another generally depends at least on the phase difference of the alternating phase shift zones. The amount may also depend on the focus value of the lithography tool used to form the pattern (the focus of the lithography tool when its forming the pattern). In some cases, only a single pattern is formed on the substrate while in other cases multiple patterns are formed on the substrate. In one embodiment, the pattern is formed at various locations on the substrate for various levels of focus to form a focus matrix.

The formation of the pattern is generally accomplished using conventional lithography techniques. In semiconductor processing, the pattern is typically printed in a photoresist layer located on a semiconductor wafer when light or radiation is made to travel through the alternating phase shift structure of the phase shift mask.

The photoresist layer when exposed to light or radiation captures the latent image produced through the alternating phase shift structure. As should be appreciated, the light or radiation induces chemical and physical changes in the photoresist that can be developed into a structural pattern. The pattern may be printed in a single exposure (as above) or multiple exposures, which include performing at least a second exposure. In a second exposure, light is made to travel through a second masking structure. For example, light may travel through a trim masking structure such that select portions of the non exposed photoresist are exposed thereby creating a different pattern (e.g., select portions of the original pattern are removed). This may be done to create a measurable pattern.

Following block 102, the process flow proceeds to block 104 where a shift in the pattern is measured. This is generally accomplished using a conventional overlay metrology tool, which can be based on scatterometry (e.g., normal or oblique incidence, etc.), scanning (e.g., U.S. Pat. No. 6,023,338 by Bareket), imaging and the like. The tool may be an in situ or ex situ tool. That is, the tool may be integrated with the lithography system or it may be a stand alone device. Because a conventional overlay metrology tool is being used, the pattern is configured to shift in a manner that can be read by the overlay metrology tool. In most cases, the pattern includes multiple structures that form measurable shifts therebetween. For example, the pattern may include a first set of lines that shift in a first direction and a second set of lines that shift in a second direction. The relative positions of the multiple structures can be compared (e.g., displacement) to determine the pattern shift. By way of example, each of the structures may be formed by one or more lines similar to box in box and related targets (e.g., box in bar, bar in bar and the like) or lines that are similar to periodic structures such as those found in U.S. patent application Ser. No. 09/894,987 to Ghinovker et al., titled "OVERLAY MARKS, METHODS OF OVERLAY MARK DESIGN AND METHODS OF OVERLAY MEASUREMENTS", filed on Jun. 27, 2001, which is hereby incorporated by reference (or equivalents thereof).

Following block 104, the process flow proceeds to block 106 where the phase difference of alternating phase shift structure is determined based at least upon the shift in the pattern. This may be accomplished using a variety of techniques. For example, a conversion may be performed wherein the pattern shift is converted into phase difference by comparing the pattern shift with calibration data such as a previously determined relationship that describes the impact of these parameters on each other, i.e., pattern shift vs. phase difference. The relationship may also include process parameters such as focus, and the like. In cases such as these, the pattern shift is converted into phase difference by comparing the pattern shift and process parameter used to form the pattern with a previously determined relationship that characterizes pattern shift, process parameter and phase difference over a wide range of values. In one particular embodiment, the pattern shift is converted into phase difference by comparing the pattern shift and focus values used to form the pattern with a previously determined relationship that characterizes pattern shift, focus and phase difference over a wide range of values. As should be appreciated, pattern shift as a function of focus depends on the phase difference of the alternating phase shift zones of the alternating phase shift structure. As such, if the pattern shift can be measured for a known focus value then the phase difference can be calculated using the previously determined relationship and the known pattern shift and focus value (once the pattern shift is calculated through focus, the phase difference can be calculated).

The relationship may be widely varied. However, in most cases, the relationship is described using equations or graphical plots. Thus, conversion calculations or graphical comparisons using the equation or graphical plot and the known values may be performed to determine the phase difference of the alternating phase shift structure. For example, the phase difference may be determined by plugging the values of the focus used in block 102 and the pattern shift determined in block 104 into an equation representative of the connection between focus, pattern shift and phase difference. In addition, the phase difference may be determined by referring to graphical plots representative of the connection between focus, pattern shift and phase difference. For instance, the pattern shift and focus will intersect on or near a contour line corresponding to the phase difference of the alternating phase shift structure. Interpolation techniques may be used when the intersection point lies between line contours corresponding to different phase differences.

The relationship may be produced using a variety of techniques. For example, the relationship may be produced using lithographic simulation methods or lithographic experimental methods. Lithographic simulation methods generally use specialized programs to calculate the relationship between pattern shift, focus and phase difference. One example of a lithography simulation program that can be used to calculate the relationship is PROLITH manufactured by KLA-Tencor of San Jose, Calif. The lithographic experimental methods, on the other hand, generally produce a relationship between pattern shift, focus and phase difference by printing a plurality of patterns on one or more test wafers using different values of focus and different alternating phase shift structures, determining the pattern shift associated with each of the structures, and correlating the pattern shift, focus and phase difference. For example, the patterns may be printed with varying levels of focus to produce a matrix of different values of focus across the wafer (e.g., focus matrix).

Following block 106, the process flow proceeds to block 108 where the phase shift mask is qualified based on the phase difference of the alternating phase shift structure(s). For instance, if the phase difference exceeds a threshold value then the mask is rejected and if the phase difference is within desired limits then the mask is accepted. When accepted, the mask may be used in subsequent lithography processing steps to build patterns on substrates (e.g., circuit patterns on semiconductor wafers). By way of example, the threshold value for acceptable phase shift masks may be between about 175 and about 195 degrees. Sometimes phase error may be used in place of the actual phase difference to qualify the mask. As mentioned above, phase error generally refers to the difference between the optimal phase difference and the determined phase difference.

When non optimal phase shift masks are used in the lithography environment, i.e., not having phase difference of 180 degrees, the determined phase difference or error may be used to correct the overlay error measured by the overlay metrology tool. That is, for a known phase difference and focus value, the pattern shift associated with a non optimal phase difference can be calculated. This calculated pattern shift can be subtracted from the overlay measurements to produce a more accurate reading of overlay error.

Harmonic analysis is one example of an algorithm that could be used to calculate the phase displacement or "pitch walk" of the phase shift target structure(s). That is, by appropriate processing of an image acquired on a conventional overlay or any other high resolution inspection or metrology tool, it will be possible through harmonic content analysis to detect very small shifts in the alternating line/space pairs which move in opposite directions. This method has the advantage that it does not require a trim mask but it requires the design of a new algorithm for measurement. An alternative method that utilizes a trim mask is shown in the subsequent pictures in which the trim mask exposes either only the pi phase or zero phase lines from each side of the line/space array. By building a suitable arrangement of such patterns a standard overlay mark can be constructed in which phase error is converted directly to an overlay error. It is important to remark that in order to determine the phase error quantitatively, it is necessary to carry out a sequence of exposures at different focal positions and calculate the slope of measured overlay through scanner focus.

Figure 5:
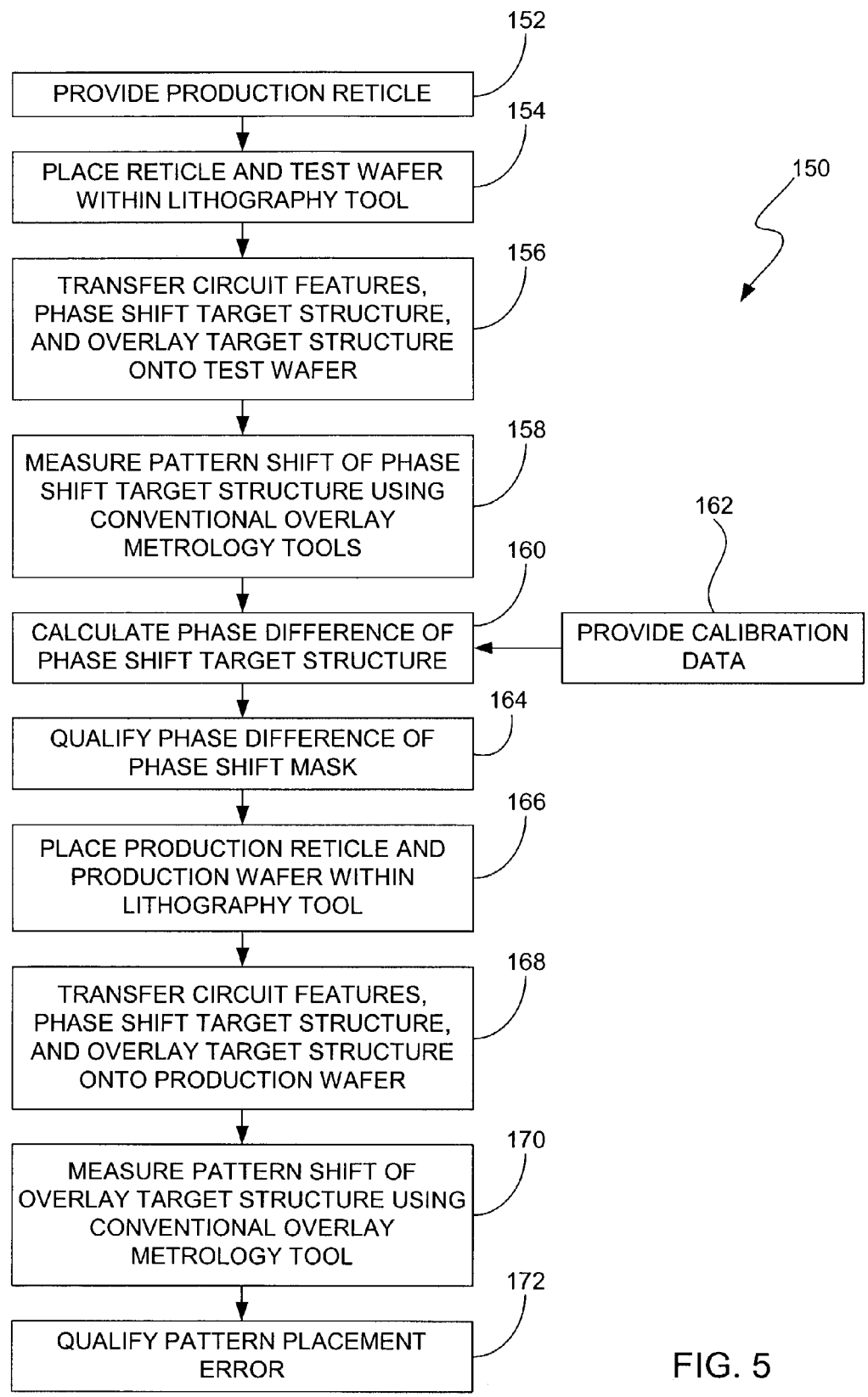
FIG. 5 is a production method, in accordance with one embodiment of the present invention.

FIG. 5 is a semiconductor production method 150, in accordance with one embodiment of the present invention. The semiconductor production method is generally performed in a lithography cell. The method generally begins at block 152 where a production reticle is provided. The production reticle is used in the lithography cell to produce various patterns associated with a semiconductor device. The production reticle has a pattern that includes one or more circuit features, phase shift target structures (e.g., targets or marks) and overlay target structures (e.g., targets or marks).

Following block 152, the process flow proceeds to block 154 where the reticle as well as a test wafer are placed within a lithography tool such as a stepper. Thereafter the process flow proceeds to block 156 where the circuit features, the phase shift target structures and the overlay target structures are transferred onto the test wafer. In most cases, the test wafer is a resist coated wafer and thus by transferring, it is generally meant that the reticle is exposed to radiation or illumination thus printing the pattern of the production reticle onto the resist coated wafer. This is generally accomplished many times across the entire wafer surface for various levels of focus, thus forming a focus matrix. For example, a first pattern may be produced with a first focus setting, a second pattern may be produced with a second focus setting and so on. The focus setting itself can be determined by a number of different methods, by way of example, KLA-Tencor's MPX technology, which is also available on KLA-Tencor metrology tools could be used for focus measurement. Other focus measurement techniques could also be used at this stage.

In this particular embodiment, the phase shift target structure is configured to include structures that shift relative to one another depending on the focus and phase difference of the phase shift target structure. These structures are also configured to be measurable by an overlay metrology tool. In one embodiment, a trim mask is used in a second exposure to form phase shift structures that are measurable by overlay metrology tools. In most cases, the trim mask is used to spatially separate the phase shift target structure into multiple structures that shift relative to one another. This embodiment will be described in greater detail below. It should be noted that the above mentioned process may also be repeated on a series of test wafers using different resist layers, different stepper settings, different steppers, different phase shift structures and/or the like in order to produce more data and thus possibly better results.

Following block 156, the process flow proceeds to block 158 where the pattern shift of the phase shift target structures formed on the wafer at their various locations are measured using conventional overlay metrology tools. Following block 158, the process flow proceeds to block 160 where the phase difference for each of the phase shift target structures are calculated. The calculation may include receiving calibration data from block 162. Calibration data 162 generally includes a relationship relating pattern shift, focus and phase difference. Using the relationship, the measured pattern shift and the known focus value for each of the phase shift target structures can be used to calculate the phase difference for each of the phase shift target structures. Thereafter, the phase difference for each of the phase shift target structures can be used to determine the overall phase difference of the phase shift target (e.g., averaging). It should be noted that resist coated wafers are not a limitation and that the patterns may be transferred to other process layers for measurement. However, resist coated wafers are typically used since they are easy to measure (e.g., they are not adversely impacted by other process layers).

Following block 160, the process flow proceeds to block 164 where the phase difference of the phase shift mask is qualified. If the phase difference is outside desired limits the process flow proceeds back to block 152 where another mask similar to the first mask is provided. If the phase difference is within desired limits, the production reticle is used in production, and the process flow therefore proceeds to block 166 where the production reticle as well as a production wafer are placed within a lithography tool such as a stepper. The lithography may be the same tool used to qualify the reticle or it may be a different lithography tool. Thereafter the process flow proceeds to block 168 where the circuit features, the phase shift target structures and the overlay target structures are transferred onto the production wafer. In most cases, the production wafer is a resist coated wafer and thus by transferring, it is meant that the reticle is exposed to radiation or illumination thus printing the pattern of the production reticle onto the resist coated wafer. In this particular block, the focus levels are maintained while the patterns are transferred.

Following block 168, the process flow proceeds to block 170 where the overlay target structures formed on the wafer are measured using conventional overlay metrology tools to determine the pattern placement error associated with the transferred pattern. The overlay metrology tool may be the same tool used to measure the phase shift target structure or it may be a different tool all together. By way of example, the overlay targets may generally correspond to box in box and related targets (e.g., box in bar, bar in bar and the like) or periodic structures such as those found in U.S. patent application Ser. No. 09/894,987 to Ghinovker et al., titled "OVERLAY MARKS, METHODS OF OVERLAY MARK DESIGN AND METHODS OF OVERLAY MEASUREMENTS", filed on Jun. 27, 2001, which is hereby incorporated by reference (or equivalents thereof).

Following block 170, the process flow proceeds to block 172 where the pattern placement error is qualified. If the pattern placement error is outside desired limits the process flow stops and the production wafer is reworked or scrapped using conventional lithographic techniques. If the pattern placement is within desired limits, the production run continues. For example, the wafer may be transported to an etching or deposition tool for further processing.

Figure 6:
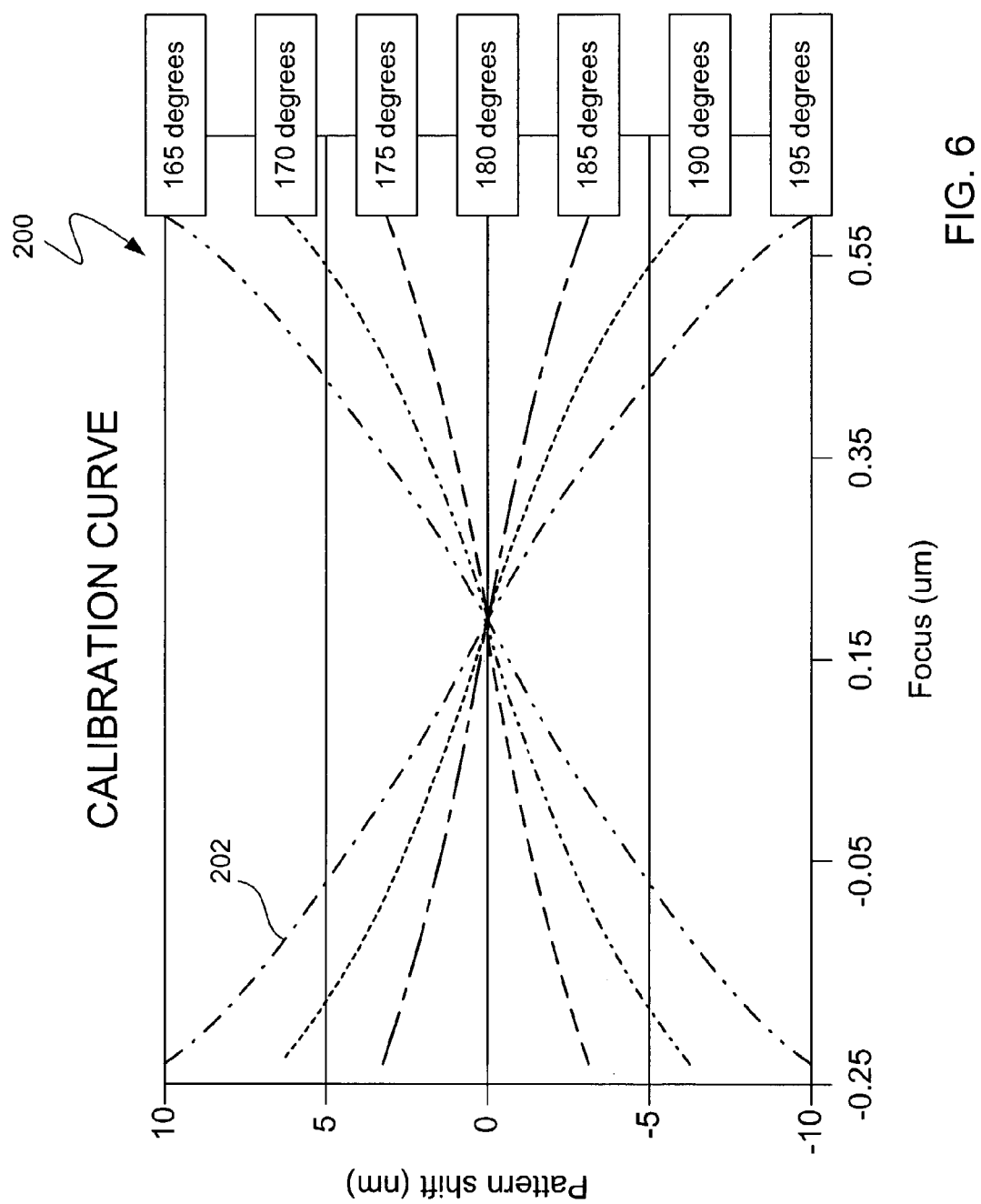
FIG. 6 is a diagram of a calibration curve, in accordance with one embodiment of the present invention.

FIG. 6 is a diagram of a calibration curve 200, in accordance with one embodiment of the present invention. The calibration curve 200 shows a relationship between pattern shift, focus and phase difference. In particular, pattern shift as a function of focus depends on phase difference. By way of example, the calibration curve 200 may be representative of the relationship used to determine phase difference when pattern shift and focus are known. For example, it may be used in block 54 of FIG. 3, block 106 of FIG. 4, and block 158 of FIG. 5. As shown, the calibration curve 200 includes a plurality of line contours 202, each of which represents a different phase shift difference. As should be appreciated, the pattern shift is zero for every value of focus when the phase difference is at the optimal value of 180 degrees. The calibration curve 200 may be formed using simulation or experimental values. In the illustrated embodiment, the calibration curve 200 was simulated using PROLITH manufactured by KLA-Tencor of San Jose. The simulations use a calibrated resist model and a vector imaging model. The simulated curve includes pattern shift versus defocus for 280 nm pitch, 193 nm, 0.6 NA, 80 nm resist lines and 0.3 sigma.

Figure 7:
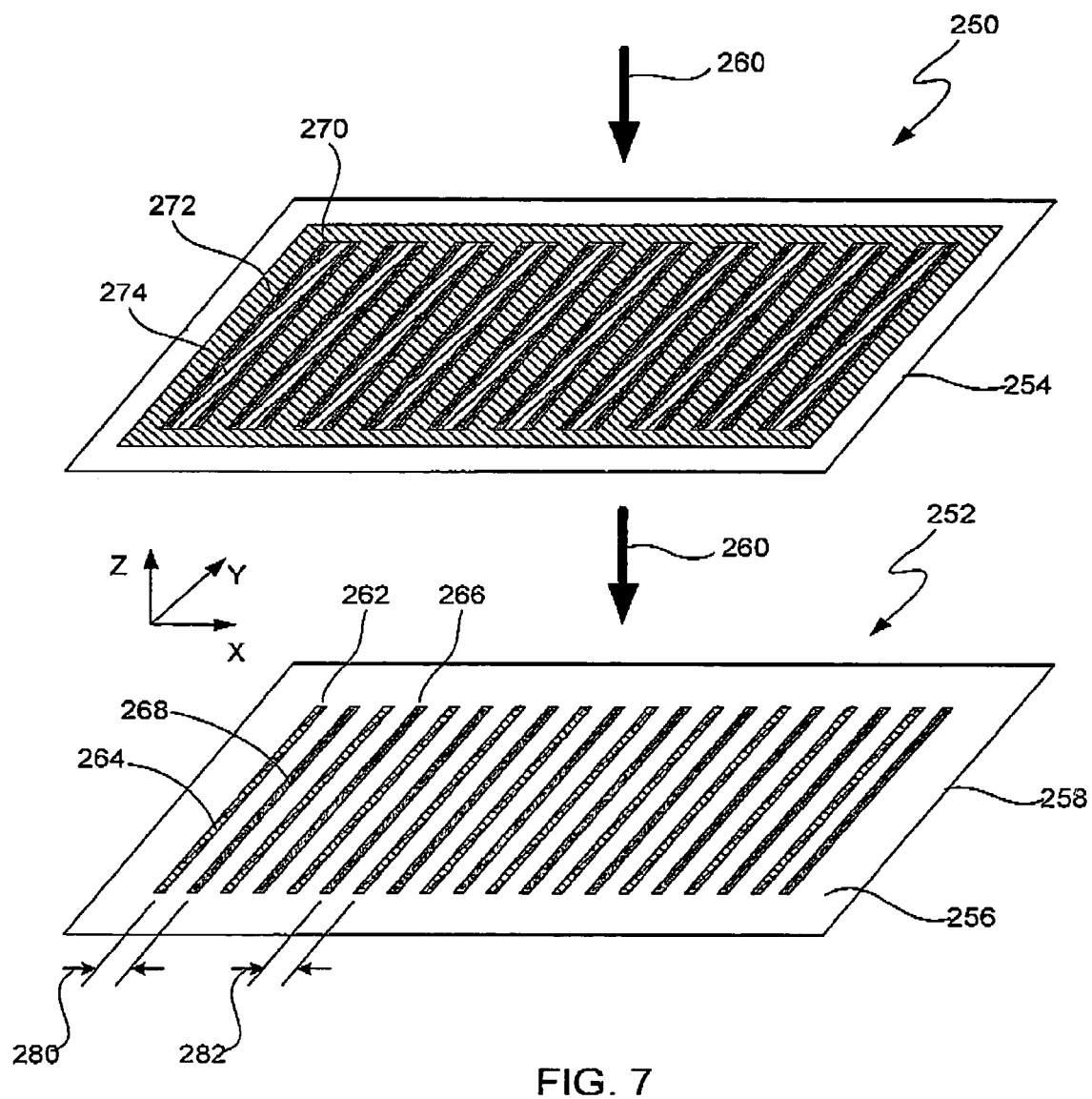
FIG. 7 is a simplified perspective view of a phase shift target structure along with a resulting pattern formed therefrom, in accordance with one embodiment of the present invention.

FIG. 7 is a simplified perspective view of a phase shift target structure 250 along with a resulting pattern 252 formed therefrom, in accordance with one embodiment of the present invention. The resulting pattern 252 produced by the phase shift target structure 250 depends on the focus value used to form the resulting pattern and the phase difference of the phase shift target structure. The phase shift target structure 250 may be used to qualify a reticle or mask, i.e., determine whether the quality of the reticle or mask meets specified requirements. The phase shift target structure 250 may be suitable for a wide variety of lithography processes, as for example, lithographic processes pertaining to semiconductor manufacturing, optical device manufacturing, micro-mechanical device manufacturing, magnetic recording data storage manufacturing and the like.

Although not shown, one or more of the phase shift target structures 250 may be positioned on a reticle or mask. In one embodiment, the phase shift target structure 250 is positioned on a product mask configured for producing a circuit pattern on a wafer. In this embodiment, the phase shift target structure 250 is generally positioned in a region of the product mask that is not used by a circuit pattern. For example, the phase shift target structure 250 may be positioned in a region that corresponds to the area of the wafer used for sawing (e.g., saw street). Any number of phase shift target structure 250 may be positioned on the product mask. Generally speaking, about 1 to about 5 phase shift target structure 250 may be used for determining the phase difference of the phase shift mask. In some cases, it may be of value to include phase shift target structures of differing feature sizes to determine whether the phase error is dependent on this parameter. This is a likely scenario, as the etch rate in the reticle is known to be dependent on the feature size.

In general, the phase shift target structure 250, which is located on a substrate 254, is used to project the phase shifted pattern 252 onto a surface 256 of a workpiece 258. In most cases, the pattern 252 is printed on the surface 256 of the workpiece 258 when light or radiation 260 is made to travel through the phase shift target structure 250. By way of example, the surface 256 may include a layer of photoresist for capturing the image produced by the phase shift target structure 250 when light 260 is passed therethrough. That is, the light or radiation induces chemical and physical changes in the photoresist that can be developed into a structural pattern.

The phase shift target structure 250 is generally configured to produce a shiftable pattern 252. More particularly, the phase shift target structure 250 is configured to produce a resulting pattern 252 having multiple structures that form measurable shifts therebetween depending on the focus value used to form them and the phase difference of the phase shift target structure 250. That is, the phase shift target structure 250 creates patterns having positions that are sensitive to focus and phase difference. For example, the phase shift target structure 250 may produce a resulting pattern 252 having a plurality of structures formed by parallel printed lines that shift in accordance with focus and the phase difference of the phase shift target structure 250.

The size and pitch of the printed lines may be arranged to coincide with the size and pitch of the lines of the circuit pattern so that the structures are more correlated with what is happening to the circuit pattern during processing. In one embodiment, the structures are periodic structures.

In some cases, the structures of the resulting pattern may be interposed or interlaced with one another such that their lines alternate from one to the other along the same axis or while in other cases they may be spatially distinct relative to one another (the structures are separated from one another rather than being interlaced therewith). Additionally, the structures of the phase shift target structure 250 may be a combination of interlaced and spatially distinct. In any of theses implementations, the structures shift relative to one another depending on focus and the phase difference. In most cases, the structures are arranged to shift both positively and negatively for various levels of focus and phase difference. In the illustrated embodiment, the structures correspond to periodic structures. A first periodic structure 262, which includes a plurality of parallel lines 264 (shown by cross hatching), is interlaced with a second periodic structure 266, which includes a plurality of parallel lines 268 (shown by shading).

The shifting structures 262, 266 are produced by the phase shift target structure 250 that generally includes a plurality of source lines 270 that are separated by alternating phase shift zones 272 and 274. The source lines 270 and phase shift zones 272 and 274 preferably correspond to the features of the phase shifted circuit pattern, i.e., have similar sizes and phase shifts. The optimal phase difference between the alternating phase shift zones 272 and 274 is preferably 180 degrees. This, however, is not always achievable when manufacturing the reticle and thus the need for the phase shift target structure 250.

When the pattern 252 is projected onto the surface 256 of the workpiece 258, the quality of the phase shift zones 272 and 274 may be determined by comparing the relative positions of the periodic structures 262, 266. For instance, the position of the first periodic structure 262 may be compared with the position of second periodic structure 266 in the X direction for a particular focus to determine the phase difference between zones 272 and 274. Because of the phase shift, the periodic structures 262, 266 are configured to shift in opposite directions. For example, the first periodic structure 262 may shift in the positive X direction and the second periodic structure 266 may shift in the negative X direction (or vice versa) thus producing a displacement that corresponds to a particular phase difference and focus. Referring to the pattern 252, adjacent lines 264 and 268 of periodic structures 262, 266 form a first spacing 280 (from lines 264 to 268) and a second spacing 282 (from lines 268 to 264) therebetween. These spacings change as a function of focus and phase difference. That is, the spacings 280, 282 change when the periodic structures 262, 266 shift in opposite directions in accordance with focus and phase difference. The change in spacings 280 and 282 are generally inverse to one another. That is, as spacing 280 gets larger, spacing 282 gets correspondingly smaller (or vice versa).

Figure 8C:
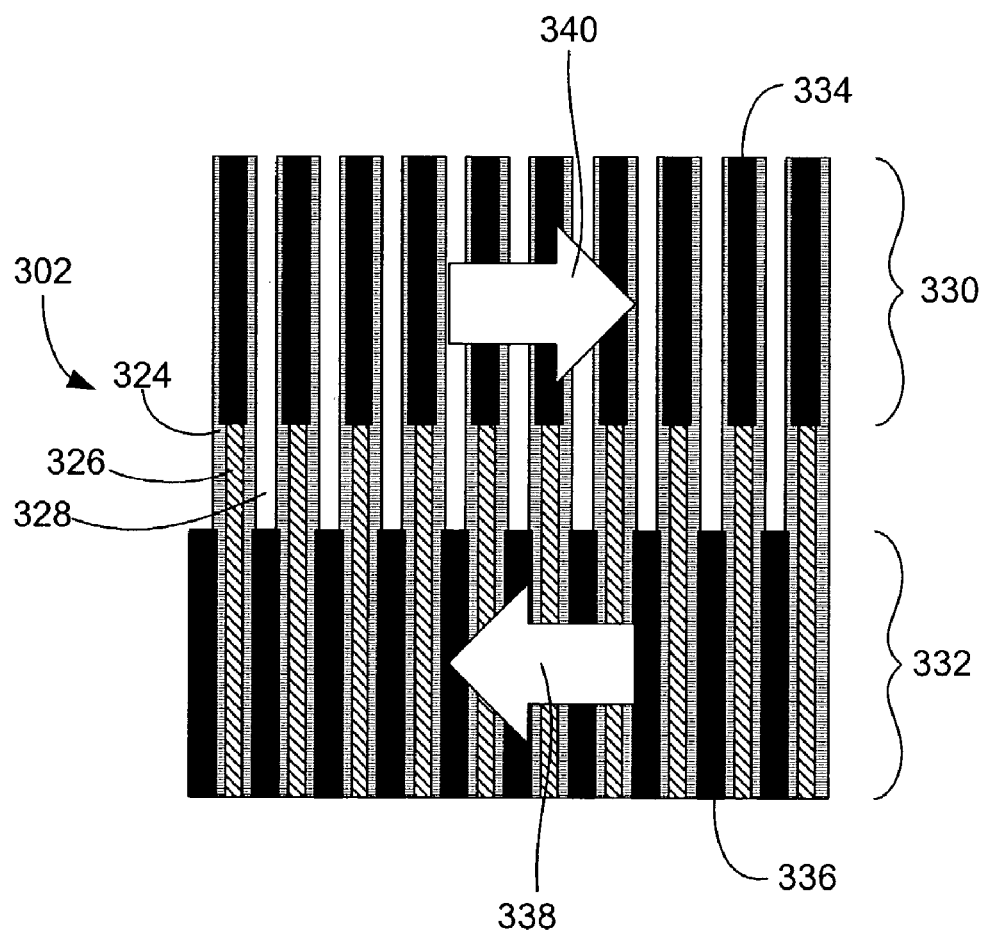

FIGS. 8A–8C are diagrams of a masking system 300, in accordance with one embodiment of the invention. The masking system 300 is configured to produce a resulting pattern 306 in two steps: a first exposure (as shown in FIG. 8A) and a second exposure (as shown in FIG. 8B). In the first exposure, light or radiation 312 is made to travel through a phase shift masking structure 302 to produce an initial pattern 305 on a wafer 308, i.e., some portions of the photoresist 310 are exposed and some portions are not expose& By way of example, the initial pattern 305 may correspond to the pattern shown in FIG. 7. In the second exposure, light or radiation 316 is made to travel through a 1dm masking structure 304 to change the initial pattern 305 into the resulting pattern 306, i.e., select portions of the non-exposed portions of the photoresist 310 are exposed. In essence, the trim masking structure 304 allows select portions of the pattern 305 to be removed therefrom so as to create a different pattern 306.

As should be appreciated, the phase shift masking structure 302 generally determines the displacement associated with the resulting pattern 306, and the trim masking structure 304 generally determines what part of the resulting pattern 306 can be measured. In the illustrated embodiment, the trim masking structure 304 is arranged to form a resulting pattern 306 having spatially distinct and multiple periodic structures 318 and 320, each of which includes a plurality of coarsely segmented lines 319 and 321, respectively.

As shown in FIG. 8C, the phase shift masking structure 302 includes a plurality of opaque lines 324, which are sandwiched between alternating phase shifted transmissive areas 326 and 328. The phase difference between the phase shifted areas 326 and 328 are preferably 180 degrees, however, this is not always the case due to manufacturing discrepancies as described above. In the illustrated embodiment, the phase shifted areas 326 and 328 are portions of a quartz substrate and the opaque lines are chrome lines. By way of example, the first phase shifted area 326 (e.g., $\phi=0$) may correspond to the surface of the quartz substrate while the second phase shifted area 328 (e.g., $\phi=\pi$) corresponds to an etched portion. It should be noted that chrome sources lines are not a limitation and that the sources lines may be formed from other materials whether metal or not. For example, the source lines may also be formed from a portion of the substrate or from other light effecting materials (e.g., chromeless phase shift mask). Additionally or alternatively, the phase shift of the phase shift zone may be altered by the addition of an attenuating phase shifter (e.g., partially transmissive material).

Still referring to FIG. 8C, the trim masking structure 304 includes a plurality of masking zones 330 and 332, each of which includes a plurality of masking lines 334 and 336 respectively. The masking lines 334 and 336 are configured to cover select portions of a pre existing pattern so as prevent further exposure thereto. That is, the trim masking lines 334 and 336 protect the areas where the pattern is desired and the open areas therebetween let the light through thereby erasing the latent pattern in the areas that are not desired. In the illustrated embodiment, the masking lines 334 of a first masking zone 330 covers portions of the first phase shifted area 326 and the masking lines 336 of a second masking zone 332 covers portions of the second phase shifted area 328. By masking these areas, the resultant pattern 306 includes at least a pair of spatially distinct periodic structures 318 and 320 as shown in FIG. 8B. Because each of the phase shifted areas produces shifts in opposing directions when there is a phase difference other than 180 degrees, the periodic structures shift relative to one another (as shown by the arrows 338 and 340). As should be appreciated, these shifts may be read by a conventional overlay metrology tool.

In one embodiment, the focus masking structure and the trim masking structure are disposed on the same substrate. In this embodiment, a stepper may move the substrate to a first position so as to make an exposure with the focus masking structure and thereafter move the substrate to a second position so as to make a second exposure with the trim masking structure. That is, the stepper may be programmed to select which portion of the mask is used at one time. In another embodiment, the focus masking structure and the trim masking structure are disposed on different substrates. In this embodiment, a stepper may move a focus masking structure on a first substrate into an exposure position so as to make a first exposure, and thereafter move a trim masking structure on a second substrate into the exposure position to make a second exposure.

Figure 9:
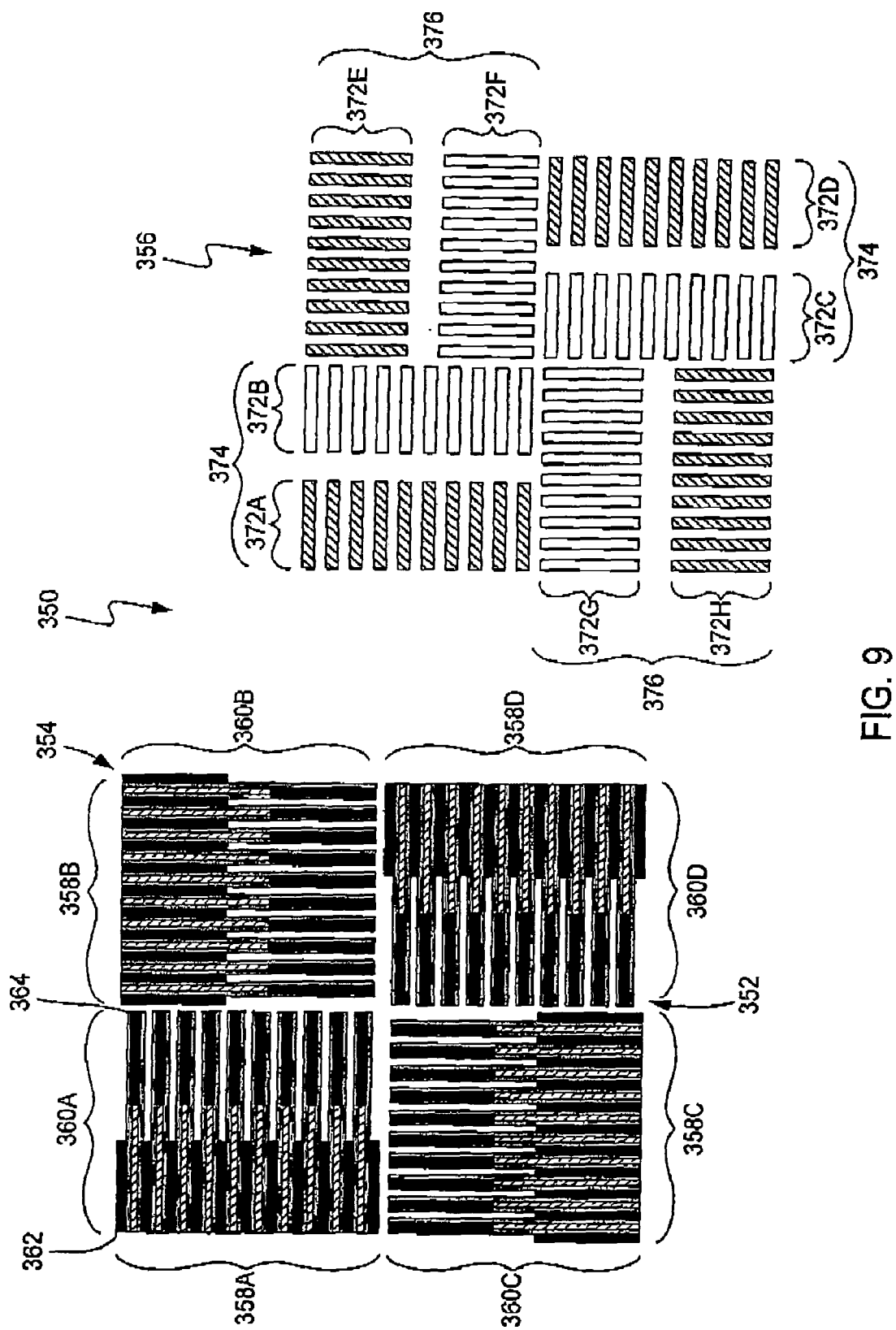
FIG. 9 is a diagram of a masking system, in accordance with one embodiment of the present invention.

FIG. 9 is a diagram of a target system 350, in accordance with one embodiment of the present invention. The target system 350, which generally includes a phase shift masking structure 352 and a trim masking structure 354, is configured to produce a phase shift overlay mark 356. By way of example, the target system may be implemented in the manner similar to that described above with regards to FIGS. 8A–C. As shown, the phase shift masking structure 352 includes a plurality of phase shifting regions 358A–D that are spatially separated from one another so that they do not overlap portions of an adjacent phase shifting region 358A–D, Phase shifting regions 358A and 358D are configured to produce shift information in a first direction as for example the Y direction while phase shifting zones 358B and 358C are configured to produce shift information in a second direction that is perpendicular to the first direction as for example the X direction. Bach of the phase shifting regions 358A–D includes a group of parallel source lines, which are separated by alternating phase shift zones. Furthermore, the trim masking structure 354 includes a plurality of masking regions 360A–D that correspond with the phase shifting regions 358A–D, respectively. The masking regions 360A–D are configured to cover select portions of a pre existing pattern formed by the phase shifting regions 358A–D. The masking regions 360A–D, which are broken up into spatially separated groups 362 and 364, include a plurality of masking lines that are parallel with the source lines of the phase shifting regions. Each of the groups is configured to cover a different area of the phase shifting region to which it corresponds as well as different phase shift zones. Group 362 covers a first set of phase shift zones and group 364 covers a second set of phase shift zones. In most cases, the different areas are adjacent one another as shown.

Using a dual exposure, the target system 350 is configured to produce the phase shift overlay mark 356. The shifting target 356 includes a plurality of structures that shift relative to one another depending on focus and the phase difference of the phase shift masking regions 358A–D. As should be appreciated, the phase shift overlay mark 356 is capable of being measured by a conventional overlay metrology tool. The mark 356 is suitable for image based overlay measurement techniques as well as other techniques such as scatterometry and scanning measurement techniques. For ease of discussion, phase shift overlay mark 356 is shown in a configuration that results when the phase difference of the phase shift masking region is optimal (e.g., 180 degrees). It should be noted, however, that the phase shift overlay mark 356 is generally provided to determine the pattern shift created by a non optimal phase difference. The phase shift mark 356 is configured to indicate pattern shifts in two separate directions (e.g., X and Y). As such, phase shift mark 356 obviates the need to have one mark for each direction in which pattern shift needs to be measured.

As shown the phase shift overlay mark 356 includes eight rectangularly shaped working zones 372A–H, which are configured to substantially fill the perimeter of the phase shift overlay mark 356. The working zones 372A–H represent the actual areas of the mark that are used to calculate the pattern shift. As shown, the working zones 372A–H are spatially separated from one another so that they do not overlap portions of an adjacent working zone 372A–H. The working zones 372A–H are grouped into a first working group 374 and a second working group 376 that are angled relative to one another thereby forming an "X" -configured mark. The first working group 374 includes four working zones 372A–D tat are configured to provide shift information in a first direction as for example the Y direction. Working zones 372A and B are positioned next to each other and diagonally opposed working zones 372C and 372D, which are also positioned next to each other. The second working group 376 includes four working zones 372E-E configured to provide shift information in a second direction that is perpendicular to the first direction as for example the X direction. Working zones 372E and F are positioned next to each other and diagonally opposed working zones 372G and 37211, which are also positioned next to each other.

Each of the working zones 372A–H includes a periodic structure comprised by a plurality of segmented lines. The linewidths, D, and spacings, s, of the segmented lines may be widely varied. As shown, each of the periodic structures substantially fills the perimeter of its corresponding working zone 372.

The periodic structures of the first group 374 are all oriented in the same direction, i.e., the coarsely segmented lines are parallel and horizontally positioned relative to each other. Similarly, the periodic structures of the second group 376 are all oriented in the same direction (albeit differently than the first periodic structures), i.e., the coarsely segmented lines are parallel and vertically positioned relative to each other. Furthermore, the periodic structures of juxtaposed working zones are configured to be aligned with one another when the phase difference is optimal and misaligned (e.g., pattern shift) when the phase difference is something other than optimal. For example, the coarsely segmented lines of working zone 372A may align with the coarsely segmented lines of working zone 372B and coarsely segmented lines of working zone 372C may align with the coarsely segmented lines of working zone 372D. In addition, the coarsely segmented lines of working zone 372E may align with the coarsely segmented lines of working zone 372F and coarsely segmented lines of working zone 372G may align with the coarsely segmented lines of working zone 372H.

It should be noted that this particular configuration of the phase shift overlay target is not a limitation and that the configuration may vary according to the specific needs of the lithography cell in which it is used. By way of example, the phase shift overlay target may correspond to any of those the overlay targets described in U.S. patent application Ser. No. 09/894,987 to Ghinovker et al., titled "OVERLAY MARKS, METHODS OF OVERLAY MARK DESIGN AND METHODS OF OVERLAY MEASUREMENTS", filed on Jun. 27, 2001, which is hereby incorporated by reference. It should also be noted that periodic structures such as these are not a limitation and that it would be possible to carry out the same phase error measurements by imaging of box in box like marks with the relevant trim mask to achieve opposite shifting on inner and outer boxes.

While this invention has been described in terms of several preferred embodiments, there are alterations, permutations, and equivalents, which fall within the scope of this invention. For example, although the invention herein has primarily been with regard to alternating phase shift masks and reticles, the invention may also be applied to attenuated phase shift masks and reticles. Unlike the embodiments described herein regarding AltPSM, the phase shift of the phase shift zones of attenuated phase shift masks and reticles are adjusted with an attenuating phase shifter alone or in addition to the previous embodiments. It should also be noted that there are many alternative ways of implementing the methods and apparatuses of the present invention. For example, it may be necessary to carry out phase error measurements for lines/spaces of different pitches and or dimensions as the phase errors are known to depend on these. It is therefore intended that the following appended claims be interpreted as including all such alterations, permutations, and equivalents as fall within the true spirit and scope of the present invention.

What is claimed is:

1. A method of inspecting a phase shift mask in a semiconductor production environment, comprising:
   receiving a phase shift mask having an unknown alternating phase shift pattern;
   forming the alternating phase shift pattern on a wafer using only the phase shift mask;
   analyzing the alternating phase shift pattern on the wafer to determine a phase difference of the alternating phase shift pattern on the phase shift mask.

2. The method as recited in claim 1 wherein the alternating phase shift pattern is configured to produce shifts when the phase difference is not optimal.

3. The method as recited in claim 1 wherein the step of analyzing includes measuring a shift of the alternating phase shift pattern formed on the wafer with an overlay metrology tool.

4. The method as recited in claim 1 wherein the step of analyzing includes calculating the phase difference of the alternating phase shift pattern by comparing a measured shift with a previously determined relationship relating shift to phase difference.

5. The method as recited in claim 1 wherein the alternating phase shift pattern is formed at various locations on the wafer with different levels of focus.

6. The method as recited in claim 5 wherein the step of analyzing includes measuring shifts of each of the alternating phase shift patterns formed on the wafer with an overlay metrology tool.

7. The method as recited in claim 6 wherein the step of analyzing includes calculating the phase difference of each of the alternating phase shift patterns by comparing the measured shifts with a previously determined relationship relating shift, phase difference and focus.

8. A method of determining the phase difference of an alternating phase shift pattern of a phase shift mask, comprising:
   providing calibration data relating pattern shift to phase difference, the calibration data including a previously determined relationship that characterizes pattern shift, focus, and phase difference over a wide range of values;
   providing a wafer with one or more phase shift structures formed thereon, the one or more phase shift structures being formed with the alternating phase shift pattern of the phase shift mask only;
   measuring a pattern shift of the one or more phase shift structures using an overlay metrology tool; and
   converting the pattern shift to phase difference by comparing the measured pattern shift with the previously determined relationship that characterizes pattern shift, focus, and phase difference over a wide range of values.

9. The method as recited in claim 8 wherein the alternating phase shift pattern includes a plurality of source lines separated by alternating phase shift zones, and wherein the one or more phase shift structures include lines that shift relative to one another depending at least in part on the phase difference of the alternating phase shift zones and the focus value used to form the one or more phase shift structures, the shift in the lines being measurable by the overlay metrology tool.

10. The method as recited in claim 9 wherein the one or more phase shift structures include a first set of lines that shift in a first direction and a second set of lines that shift in a second direction opposite the first direction.

11. The method as recited in claim 10 wherein the relative positions of the first and second set of lines are compared to determine the pattern shift.

12. The method as recited in claim 11 wherein the lines of the one or more phase shift structures shift when the phase difference is not optimal.

13. The method as recited in claim 12 wherein the optimal phase difference is 180 degrees.

14. The method as recited in claim 8 wherein the one or more phase shift structures are printed in a layer of photoresist disposed on the wafer.

15. The method as recited in claim 14 wherein the one or more phase shift structures are printed in a single exposure.

16. The method as recited in claim 14 wherein the one or more phase shift structures are printed in multiple exposures.

17. The method as recited in claim 8 wherein the overlay metrology tool is based on scatterometry, scanning or imaging techniques.

18. The method as recited in claim 8 wherein the wafer includes a plurality of phase shift structures positioned at different locations an the wafer, at least two of the phase shift structures being formed with different levels of focus.

19. The method as recited in claim 18 wherein each of the phase shift structures are measured with the overlay metrology tool.

20. The method as recited in claim 8 wherein the previously determined relationship is produced via lithographic simulation methods or lithographic experimental methods.

* * * * *

UNITED STATES PATENT AND TRADEMARK OFFICE
CERTIFICATE OF CORRECTION

PATENT NO. : 7,075,639 B2  Page 1 of 1
APPLICATION NO. : 10/423827
DATED : July 11, 2006
INVENTOR(S) : Adel et al.

It is certified that error appears in the above-identified patent and that said Letters Patent is hereby corrected as shown below:

In the Specification:

Column 12, line 1, change "expose&" to --exposed--.

Column 12, line 4, change "1dm masking" to --trim masking--.

Column 13, line 26, change "Bach" to --Each--.

In the Claims:

In line 3 of claim 18 (column 16, line 45) change "an the wafer" to --on the wafer--.

Signed and Sealed this

Twentieth Day of February, 2007

JON W. DUDAS
*Director of the United States Patent and Trademark Office*